(12) United States Patent
Renau et al.

(10) Patent No.: US 9,455,335 B2
(45) Date of Patent: Sep. 27, 2016

(54) TECHNIQUES FOR ION IMPLANTATION OF NON-PLANAR FIELD EFFECT TRANSISTORS

(71) Applicant: Varian Semiconductor Equipment Associates, Inc., Gloucester, MA (US)

(72) Inventors: Anthony Renau, West Newbury, MA (US); Hans-Joachim L. Gossmann, Summit, NJ (US)

(73) Assignee: Varian Semiconductor Equiment Associates, Inc, Gloucester, MA (US)

(*) Notice: Subject to any disclaimer, the term of this patent is extended or adjusted under 35 U.S.C. 154(b) by 0 days.

(21) Appl. No.: 14/080,461

(22) Filed: Nov. 14, 2013

(65) Prior Publication Data

US 2015/0132907 A1    May 14, 2015

(51) Int. Cl.
*H01L 21/8236*    (2006.01)
*H01L 29/66*    (2006.01)

(52) U.S. Cl.
CPC ..... *H01L 29/6681* (2013.01); *H01L 29/66537* (2013.01); *H01L 29/66545* (2013.01)

(58) Field of Classification Search
CPC ............... H01L 29/6681; H01L 29/66537; H01L 29/66545
USPC ............... 438/163, 194, 276, 278, 283, 289
See application file for complete search history.

(56) References Cited

U.S. PATENT DOCUMENTS

| | | | |
|---|---|---|---|
| 7,972,914 B2 * | 7/2011 | Kim et al. | 438/173 |
| 2005/0285204 A1 * | 12/2005 | Kim et al. | 257/368 |
| 2014/0227850 A1 * | 8/2014 | Zhang et al. | 438/289 |

* cited by examiner

*Primary Examiner* — Kevin M Picardat (57) ABSTRACT

A method of forming a fin field effect transistor (finFET) device includes forming a fin structure on a substrate, the substrate comprising a semiconductor material and forming a replacement gate cavity comprising an exposed portion of the fin structure and a sidewall portion adjacent the exposed portion, wherein the exposed portion of the fin structure defines a channel region. The method further includes performing at least one implant into the exposed portion of the fin structure.

17 Claims, 7 Drawing Sheets

TECHNIQUES FOR ION IMPLANTATION OF NON-PLANAR FIELD EFFECT TRANSISTORS

FIELD

The present embodiments relate to processing of field effect transistors, and more particularly to ion implantation of non-planar field effect transistors.

BACKGROUND

As semiconductor devices scale to smaller dimensions, non-planar transistors are increasingly attractive as alternatives to planar transistors due to the limits on scalability imposed by planar transistor geometry. For example, so-called fin field effect transistors (finFET) have been deployed in complementary metal oxide semiconductor (CMOS) technology for the 22 nm device generation. A finFET is a type of three dimensional (3-D) transistor in which a narrow strip of semiconductor material (fin) that extends vertically from a main substrate surface is used to form source/drain (S/D) and channel regions of the transistor. A transistor gate is then deposited to wrap around opposite sides of the fin thereby forming a gate structure that bounds multiple sides of the channel.

During processing to form a conventional finFET after etching the semiconductor substrate to define a fin structure, isolation oxide, often referred to as shallow trench isolation (STI) oxide, is deposited. The oxide is then etched back so that that fin structure extends above the oxide to a designed amount according to the desired fin height. Subsequently the exposed fin structure is subject to threshold voltage implants, well implants, punch through stopping implants, and annealing processes. In the replacement gate process for forming a finFET, a further series of processing steps involves deposition of a dummy gate structure, formation of spacers, and deposition of a raised source/drain structure before the dummy gate is replaced via a series of etching and deposition steps with the final gate structure. These process steps entail an extensive thermal budget that may adversely affect the implants performed in early processing steps after the fin formation. Accordingly, resultant device performance of finFETs may be less than desired.

As transistor dimensions scale to even smaller dimensions the above problems may be further exacerbated due to the decreased tolerance for dopant diffusion and dopant loss that may be induced during finFET processing.

It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of forming a fin field effect transistor (finFET) device includes forming a fin structure on a substrate, the substrate comprising a semiconductor material and forming a replacement gate cavity comprising an exposed portion of the fin structure and a sidewall portion adjacent the exposed portion, wherein the exposed portion of the fin structure defines a channel region. The method further includes performing at least one implant into the exposed portion of the fin structure.

In a further embodiment a method is disclosed to control threshold voltage in a fin field effect transistor (finFET) device comprising a fin structure formed integrally within a semiconductor material. The method includes forming a dummy gate that bounds a channel region of the fin structure, forming a source/drain region in a second portion of the fin structure outside the channel region, annealing the source/drain region, removing the dummy gate, and implanting the channel region of the fin structure after the annealing the source/drain region.

DETAILED DESCRIPTION

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned finFET devices embodiments are described herein that provide improved techniques for forming finFET devices. The present embodiments in particular provide novel processing sequences that may simplify manufacturing of finFET devices and improve control of dopants in a channel region of finFETs. This leads to superior device properties including better control of threshold voltage of finFET devices.

Figure 1:
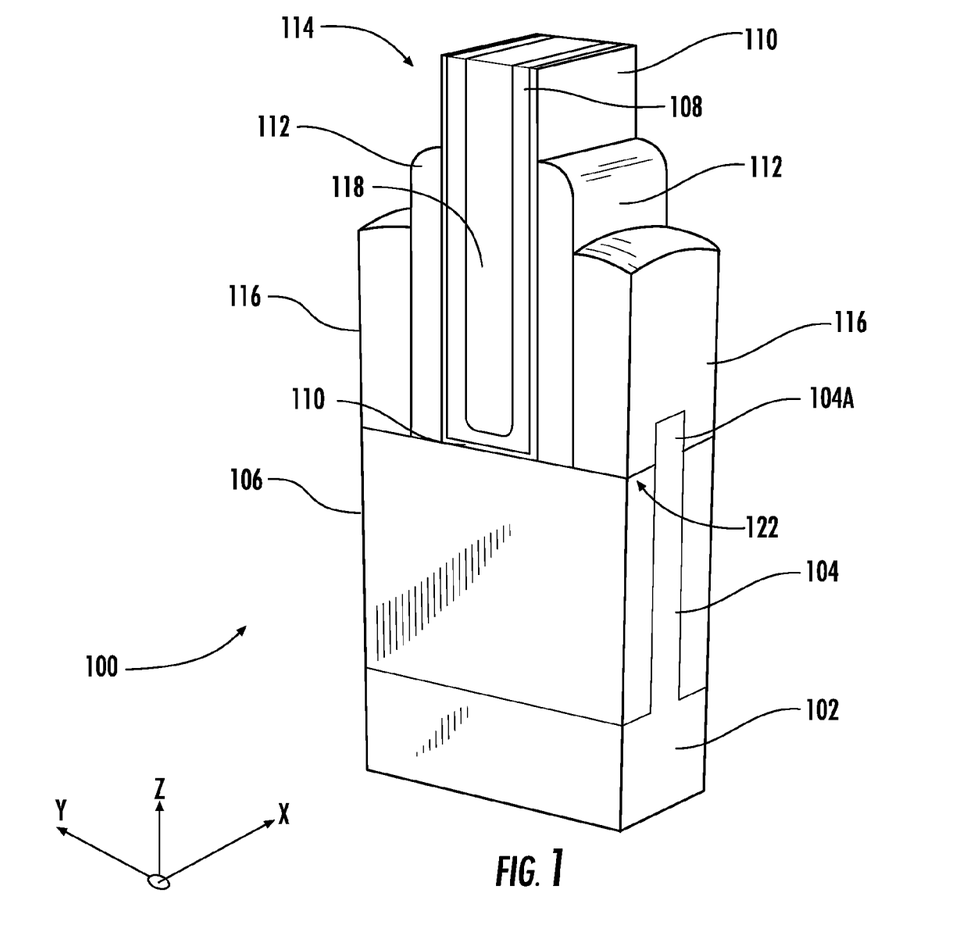
FIG. 1 illustrates an exemplary finFET structure.

For clarity of illustration of the process flow for fabricating a finFET according to the present embodiments FIG. 1 illustrates an exemplary finFET before back-end-of-line processing. The term "back-end-of-line" refers to processes used during fabrication of a device circuit such as a set of CMOS devices, where the back-end-of-line processes take place after formation of discrete transistor devices; such processes are used to form contacts to transistor devices and connect transistor devices to other devices and other circuits. Back-end-of-line processes generally involve the assembly of multiple wiring levels that entail deposition of interval dielectric, formation of vias, formation of contacts, and formation of wiring at various levels. The term "finFET device" as used herein may refer to a device such as a CMOS device that includes multiple different finFETs, each of which is a transistor. The finFET 100 shown in FIG. 1 represents a discrete transistor device before contacts to the device have been formed or interlevel dielectric, wiring, or vias have been formed to connect the finFET to other devices. In various embodiments the finFET 100 may be an n-type field effect transistor (nFET) or a p-type field effect transistor (pFET). However, the architecture for an nFET or pFET arranged according to the present embodiments may be generally represented by the finFET 100.

The finFET 100 includes a base portion 102 made of semiconductor material, and a fin structure 104 that is integrally formed within the base portion 102. The fin structure 104 acts as source/drain (S/D) regions (not separately shown) and channel region of the finFET 100, which regions lie within the thin slab formed by fin structure 104. In various embodiments the base portion may be single crystalline silicon, single crystalline, silicon:germanium alloy, silicon:carbon alloy or other semiconductor material, such as a III-IV compound semiconductor including GaAs, $In_xGa_{1-x}As$, or other semiconductor. In other embodiments, the base portion 102 may be a single crystalline semiconductor layer that is disposed on an insulator layer (SOI). The embodiments are not limited in this context.

The fin structure 104 is flanked by isolation oxide 106, which is recessed to a level 122 to expose a top region 104A of the fin. A work function metal 108 is disposed as a layer on three sides of the top region 104A of the fin structure 104. A gate insulator 110 is provided between the top region 104A and work-function metal 108. The work-function metal 108 may be chosen according to its work function to provide the appropriate gate control as is known in the art. The gate insulator 110 may consist of more than one dielectric layer as is known in the art. A gate metal 118 may fill the remaining region between adjacent layers of the work-function metal. A RSD spacer 112 separates the gate 114 from the raised source/drain 116. The raised source/drain 116 may act to lower overall device resistance and provide a region for silicide contact formation. Current in the finFET 100 is conducted in a direction generally parallel to the Y-axis in the Cartesian coordinate system shown.

In order to control transistor properties of the finFET 100 the channel region of the fin structure 104 is implanted to adjust the threshold voltage to a proper level. As discussed below, in the present embodiments, a threshold voltage implant is performed in a manner that improves the ability to control threshold voltage in comparison to conventional finFET fabrication. In particular, the sequence in which threshold voltage implantation is performed is altered from that of conventional finFET processing, which results in greater change in threshold voltage for a given implantation dose. The present embodiments take advantage of the fact that the channel region of a finFET being fabricated may be exposed multiple times during finFET processing. Accordingly, in various embodiments, the instance in which at least one implantation process (implant) is performed is delayed with respect to conventional finFET processing in which implantation processes such as well implants and threshold voltage implants are performed when the channel region is initially exposed. This allows the threshold voltage ($V_T$) adjustment implant to be performed subsequently to many processes that may otherwise tend to transport dopant ions introduced during a $V_T$ adjustment implant away from their intended location. As a result, less dopant diffusion/segregation may take place, resulting in a larger change in threshold voltage in the final finFET device after processing is complete.

Figure 2:
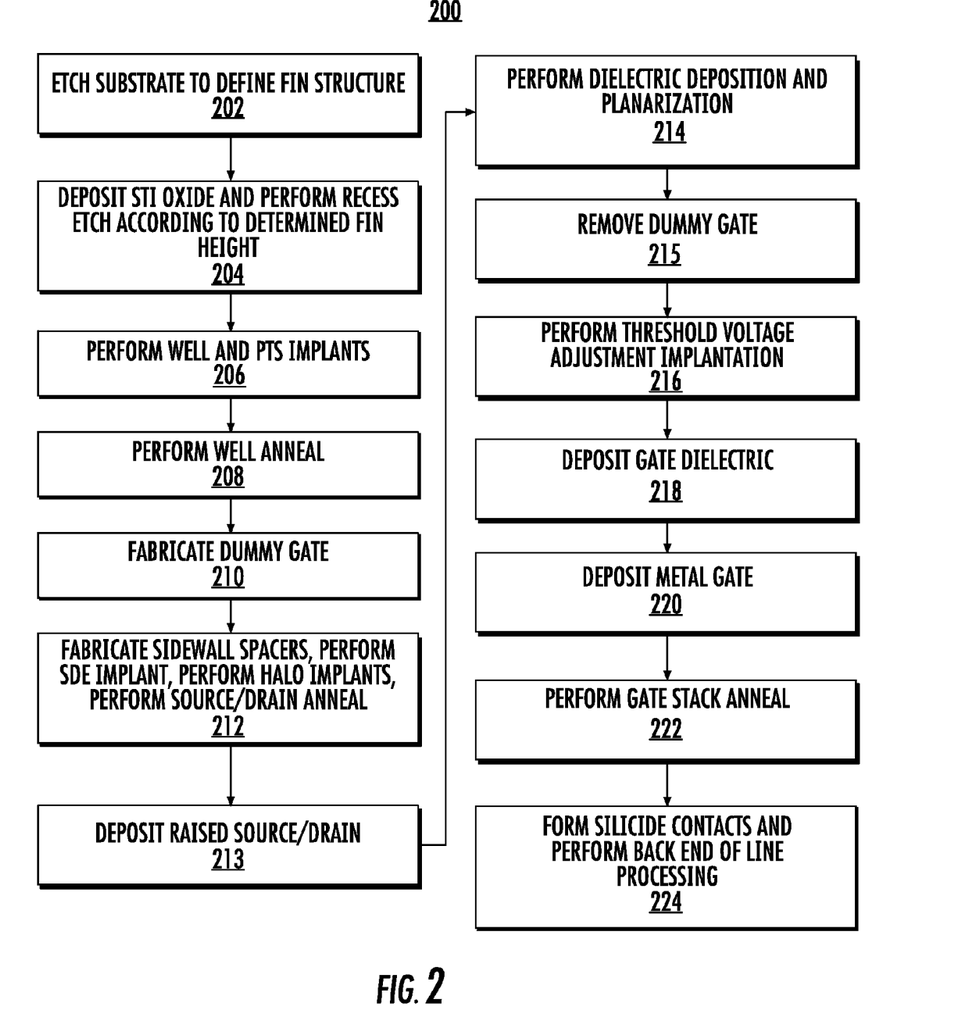
FIG. 2 presents an exemplary process flow for forming a finFET.

FIG. 2 depicts an exemplary processes sequence 200 for fabricating a finFET consistent with the present embodiments. FIGS. 3A-3J depict isometric views of a finFET structure at various stages during finFET processing that may correspond to different points is the process sequence 200 as noted. The processes shown in process sequence 200 may generally correspond to the order shown in FIG. 2, e.g., block 204 occurs after block 202, block 206 after 204, and so forth. It is to be noted, however, that the complete sequence of processes for fabricating the finFETs is not necessarily depicted. Moreover, each process may comprise multiple operations that are not individually depicted or described.

Figure 3A:
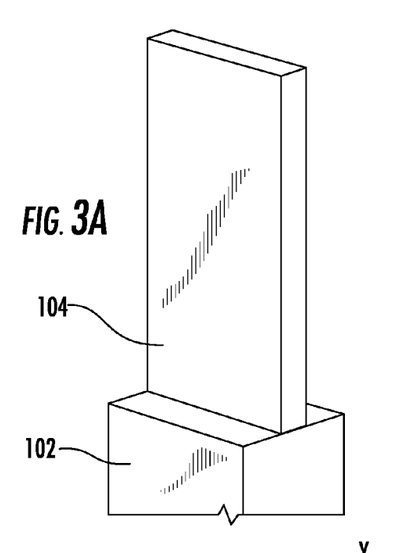
FIGS. 3A-3J depict isometric views of a finFET structure at various stages during finFET processing according to embodiments of the disclosure.

At block 202 a substrate is etched to define a fin structure. The etching may take place according to conventional processing in which masking is provided to define a narrow fin type structure that extends from a substrate. FIG. 3A depicts an exemplary structure in which the fin structure 104 has been etched from a substrate base portion 102. In some embodiments a width of the fin structure 104 along the X-axis may be 25 nm or less, and in particular may be 10 nm. The embodiments are not limited in this context.

Figure 3B:
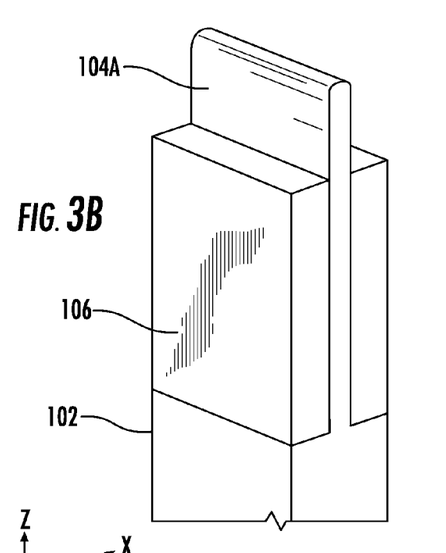

At block 204, an isolation oxide, such as shallow trench isolation (STI) oxide is deposited on the substrate including the fin structure. The oxide is etched back in order to recess the oxide below a surface of the fin structure according to a desired fin height. FIG. 3B illustrates the fin structure at one instance after etch back to form an exposed region of the fin structure 104, which is shown as top portion 104A. The top portion 104A extends a determined height along the Z-direction above the surface of the isolation oxide 106. At block 206 a set of implantation processes are performed in which ions are directed into the exposed fin portion, such as the top portion 104A. These implants include well implants and punch through stopping (PTS) implants, which may be performed in a conventional manner. A well implant may be used to provide isolation between nFETs and pFETs and prevent latch-up. For example, an n-type implantation using P, As, or Sb, may be performed to generate an n-well to surround a pFET, and B-, Ga-, or In implantation may be used to generate a p-well to surround an nFET. One exemplary nwell formation is implantation of P ions at 2 E13/cm² dose and 100 keV ion energy. An exemplary pwell formation is implantation of B ion ions at 2 E13/cm² and 30 keV ion energy.

At block 208 annealing of the finFET structure containing the well implants is performed. It is to be noted that in the process sequence 200, unlike conventional finFET fabrication processes, no $V_T$ adjustment implantation is performed at this stage of processing.

Figure 3C:
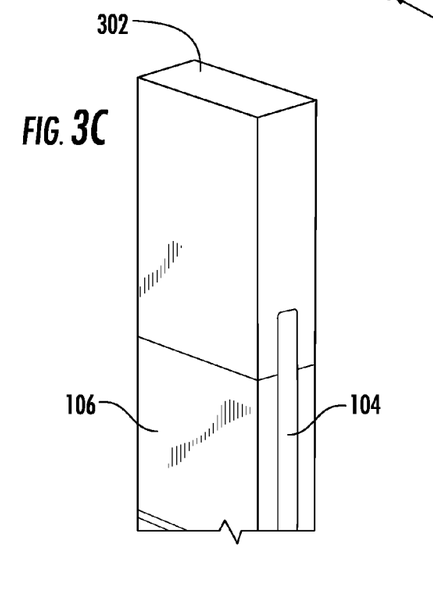
Figure 3D:
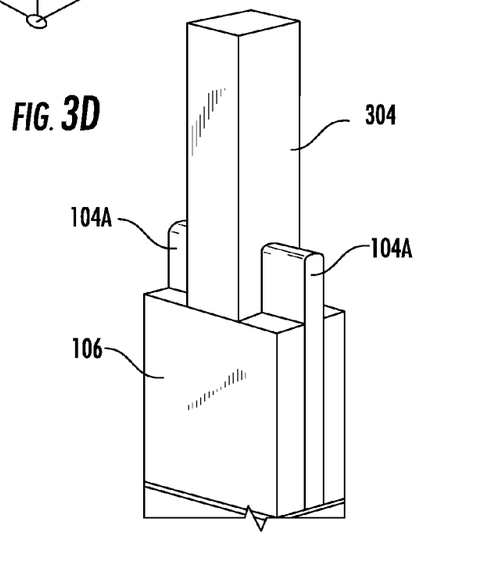

At block 210, a dummy gate is fabricated upon the existing finFET structure. FIG. 3C depicts a finFET structure at the stage in which a blanket dummy gate layer 302 has been deposited. The dummy gate layer 302 may be a conventional poly-Si layer as known in the art. Subsequently a mask is applied to define the dummy gate, and the dummy gate layer 302 is etched to form the dummy gate. FIG. 3D depicts the finFET structure after patterning to form a dummy gate 304. As illustrated, the patterned dummy gate 304 merely partially covers the top portion 104A of the fin structure 104. The dummy gate 304 in particular defines a channel region (not shown) of the eventual finFET to be formed, which is bounded by the dummy gate 304.

At block 212, sidewall spacers are formed on the sides of the dummy gate, an source/drain extension implant and halo implant are performed, and source/drain anneal is performed. In particular, a first S/D extension spacer may be formed, which may be relatively thin, such as several nanometers in thickness.

Figure 3E:
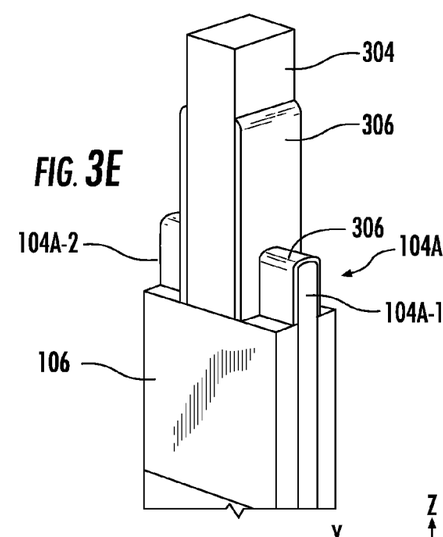
Figure 3F:
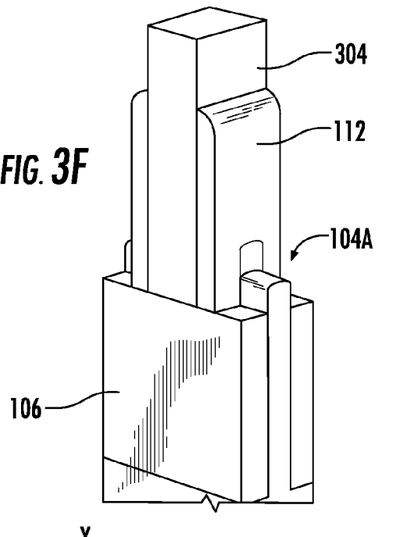
Figure 3G:
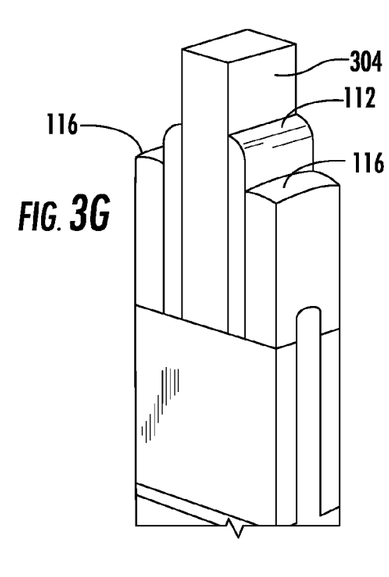

FIG. 3E depicts the finFET structure after formation of a S/D extension spacer 306, which covers sidewalls of the dummy gate 304 and the top portion 104A of the fin structure 104. This S/D extension spacer 306 may be used to space S/D extension implantation process at the appropriate distance from the channel region. Such a S/D extension implantation may be used to form portions of source and drain regions within regions 104A-1 and 104A-2 of the top portion 104A of the fin structure 104 that lie outside the channel. Together with subsequently formed raised source/drain regions, the implanted regions 104A-1 and 104A-2 of the fins may form source/drain regions in the final finFET. Subsequently as shown in FIG. 3F, a larger sidewall spacer, termed a "raised source/drain (RSD) spacer" 112 may be formed. The RSD spacer 112 may be used to space a raised S/D structure on the top portion 104A. After definition of the RSD spacer 112 a recess etch takes place that extends a certain distance into the exposed portion of the fin. In subsequent processing, as shown in block 213 a raised source/drain 116 may be formed using conventional processing on the top portion 104A as illustrated in. FIG. 3G. The raised source/drain 116 may comprise selectively epitaxially grown semiconductor material such as silicon, which may grow from all exposed surfaces of the top portion 104A as shown in FIG. 3G.

At block 214, a dielectric deposition is performed. The dielectric may fill portions of the FinFET structure. The dielectric deposition is followed by a planarization step such as a chemical mechanical polishing.

Figure 3H:
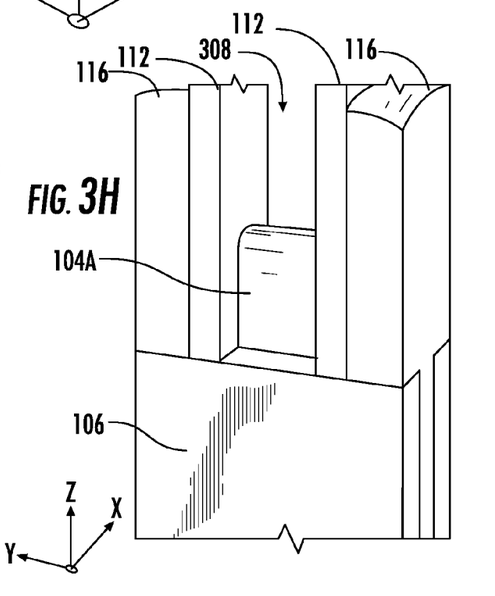

At block 215, the dummy gate of the finFET structure is removed. FIG. 3H depicts the finFET structure after removal of the dummy gate 304. The etch process employed for removing the dummy gate may be a conventional selective etch that selectively etches the dummy gate 304 with respect to the RSD spacer 112 and dielectric. After removal, a cavity region 308 is produced between opposing RSD spacers 112. The removal of the dummy gate is performed in a manner that preserves the top portion 104A within the cavity region 308. In the present embodiments, because the top portion 104A is once again exposed, ion implantation processes that were postponed during initial stages of finFET fabrication, such as that depicted in FIG. 3B, may be conveniently performed at the stage illustrated in FIG. 3H.

Figures 3I, 3J:
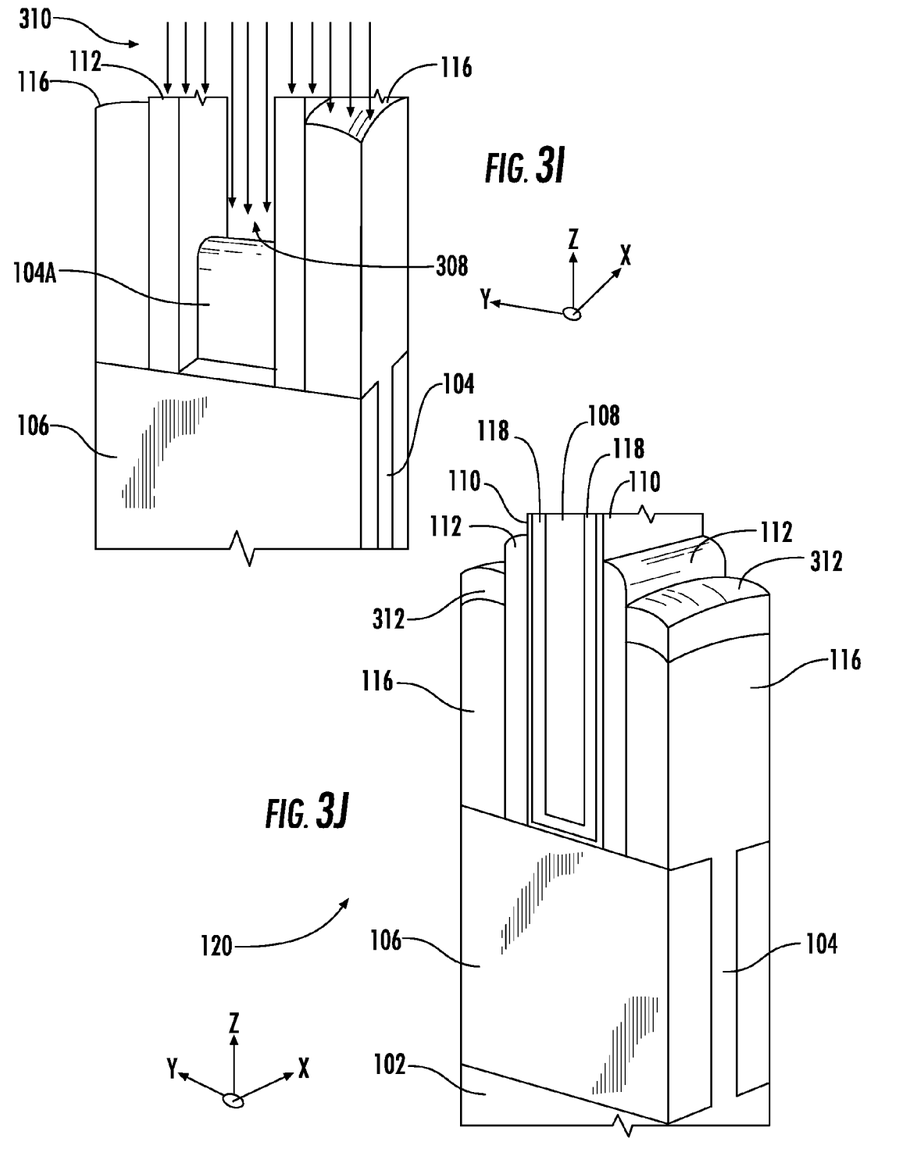

Turning now to block 216, a threshold voltage adjustment implantation process is performed. FIG. 3I depicts ion implantation of ions 310 that are directed to the finFET structure as discussed above for FIG. 3H. The ions 310 that enter the cavity region 308 may strike the top portion 104A and implant therein up to the desired implant dose. This top portion 104A corresponds to an exposed channel region of the final finFET to be formed. In some embodiments, the threshold voltage adjustment implantation process may comprise an ion dose and ion energy the same as that employed in a conventional finFET fabrication process in which threshold voltage adjustment implantation takes place before dummy gate formation. However, as detailed below, the swing in threshold voltage generated for a given ion dose may be substantially greater in the present embodiments as compared to conventional finFET processing sequences. Accordingly, in other embodiments the ion dose or ion energy may be different in the threshold voltage adjustment implantation compared to that employed for the conventional threshold voltage adjustment implantation that is performed before dummy gate formation. In some embodiments, the ions 310 may be directed so that their trajectories are parallel to the Z direction as shown in FIG. 3I.

At block 218 a gate dielectric is deposited on the finFET, that is, on the top portion of the finFET that is exposed within the cavity formed after removal of the dummy gate. The gate dielectric may be formed by a conventional process used for conventional finFET fabrication, and may be a conventional high dielectric constant material. In various embodiments a thin oxide layer such as silicon oxide is formed first followed by a high dielectric constant material. At block 220, a work function (WF) metal gate material is deposited on the gate dielectric. The WF metal gate material may also be a conventional metal used for finFET fabrication and selected to adjust threshold voltage according to its work function. The WF metal gate material may be deposited in a conventional manner. At block 222, annealing of the finFET having the high dielectric constant gate dielectric and metal gate stack is performed.

Subsequently a further fill metal may be deposited to fill the cavity formed by removal of the dummy gate and formation of dielectric layers and WF-metal gate material. In one variant, annealing of the finFET may take place after the fill metal is deposited.

At block 224 contacts are formed on the finFET and the device is processed through back-end-of-line processes. FIG. 3J depicts a finFET after silicide contacts 312 are formed in S/D regions. The finFET 120 may be substantially similar to the finFET 100 of FIG. 1, save for the fact the finFET 120 also has silicide contacts 312 shown. It is to be noted that the above flow may not present all operations for fabricating a finFET device as will be readily appreciated by those of ordinary skill in the art.

An advantage of the present embodiments, as illustrated in FIGS. 1-3J is that using ion implantation into the channel region to control $V_T$ is more effective than in conventional finFETs in which threshold voltage implantation is performed before dummy gate formation. As shown in the process sequence 200 and discussed above, the threshold voltage adjustment implantation does not take place until after well annealing is performed, after dummy gate is deposited and removed, and after raised S/D drain is deposited, among other processes. Thus, the ions implanted during the threshold voltage adjustment implantation are not subject to the thermal budget associated with each of these processes. For instance, in one example well annealing may entail annealing at 800° C. for many minutes such as 20-30 minutes. This facilitates retention of the intended ion dose used in the threshold voltage adjustment implant because overall thermal budget subsequent to the $V_T$ adjustment implant is substantially reduced as compared to that of conventional finFET devices.

Figure 4:
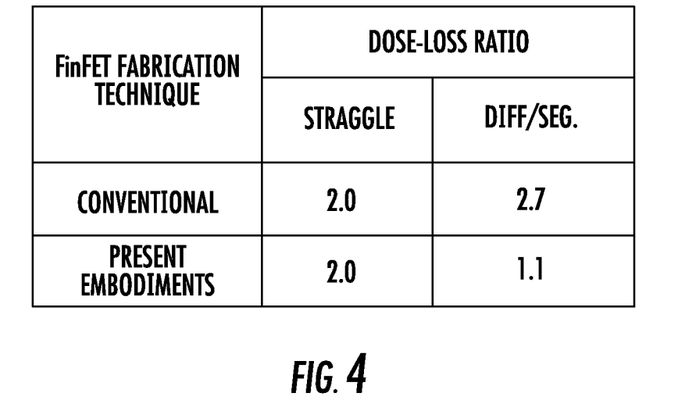
FIG. 4 depicts results of analysis of substrates subject to threshold voltage implantation after processing according to conventional finFET fabrication techniques and after processing according to the present embodiments.

The present inventors have investigated, using Technology Computer Aided Design (TCAD) techniques, the effect of the use of the techniques of the present embodiments on the physical properties and device characteristics of finFETs thus formed. FIG. 4 depicts results of analysis of substrates subject to threshold voltage implantation after processing according to conventional finFET fabrication techniques and after processing according to the present embodiments. The results show the dose-loss in terms of straggle and diffusion/segregation components. As illustrated, the straggle value (2.0) remains the same in conventional processing and in processing according to the present embodiments. This is to be expected since the fin portion is exposed in both techniques during threshold voltage adjustment implantation. However, the diffusion/segregation dose-loss value is reduced from 2.7 for conventional processing to 1.1 for processing according to the present embodiments. This illustrates that the present embodiments are effective in reducing the phenomenon of dopant segregation to nearby surfaces, which is a known problem in finFET formation due to the very small distances between various surfaces of the finFET and the target region within the fin where ion implantation is directed.

Figure 5:
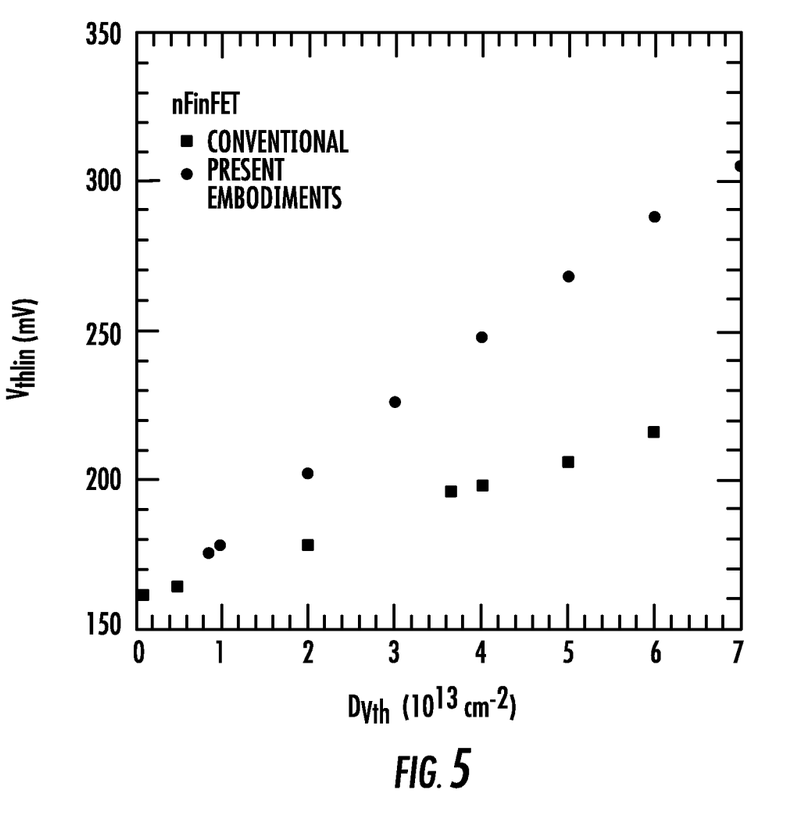
FIG. 5 compares the simulated linear threshold voltage ($V_{Tlin}$) as a function of threshold voltage adjust implant dose for n-type finFETs (nFETs) processed according to conventional techniques and according to the present embodiments.

FIG. 5 compares the linear threshold voltage ($V_{Tlin}$) for n-type finFETs (nFETs), obtained from TCAD simulations, processed according to conventional techniques and according to the present embodiments. The $V_{Tlin}$ values are shown as a function of implantation dose $D_{vth}$ for the threshold voltage adjustment implantation process. As illustrated, in the conventional finFET, $V_{Tlin}$ increases from 160 to 215 mV when the ion dose is varied from 0 to 6E13/cm$^2$. Over the same range $V_{Tlin}$ increases from 160 to 290 mV when the n-finFET is processed according to the present embodiments such that the threshold voltage adjustment implantation is performed after dummy gate removal. These results translate into an improvement from ~9 mV/1E13/cm$^2$ for conventional nfinFETs to ~22 mV/1E13/cm$^2$ for nfinFETs processed according to the present embodiments.

Accordingly, it can be seen that the present embodiments provide a much more effective route for adjusting threshold voltage using ion implantation. In one example, for a given implantation dose a greater swing in threshold voltage is achieved. Alternatively, for a given desired threshold voltage swing the present embodiments require less implantation dose.

Figure 6:
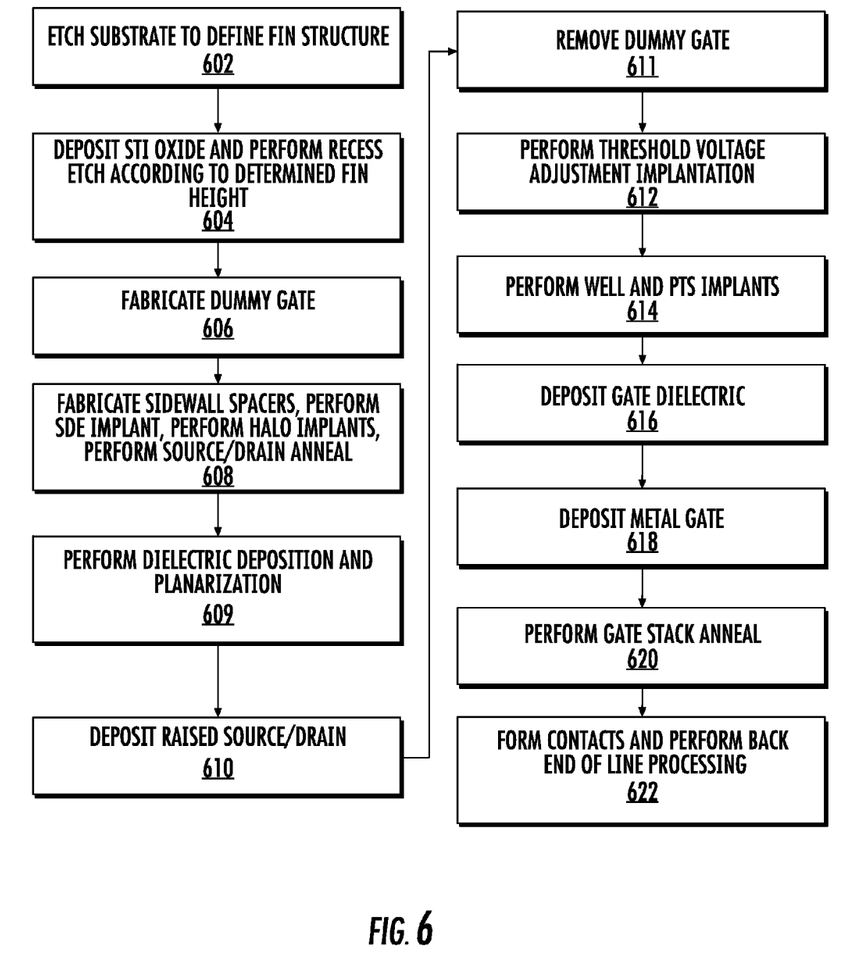
FIG. 6 depicts another process sequence for forming a finFET consistent with further embodiments.

In further embodiments, the sequence for performing additional implantation steps may be adjusted to take advantage of the multiple instances in which a fin channel region is exposed during processing. FIG. 6 depicts another process sequence 600 for forming a finFET consistent with further embodiments. At block 602, the substrate is etched to define the fin structure. At block 604 an STI oxide is deposited and etched to expose the fin structure according to a determined height. At block 606 a dummy gate is fabricated. Notably, in this embodiment no well implantation is performed before formation of the dummy gate. At block 608 sidewall spacers are formed to flank the dummy gate. S/D extension implants may be performed and halo implants during this sequence as discussed above, for example, after a S/D extension spacer is initially deposited, as well as source/drain annealing.

At block 609, a dielectric deposition is performed. The dielectric may fill portions of the FinFET structure. The dielectric deposition is followed by a planarization step such as a chemical mechanical polishing. At block 610, a raised source/drain is deposited. At block 611, after the raised source/drain is deposited the dummy gate is removed.

At block 612, after the removal of the dummy gate a threshold voltage adjustment implantation is performed into the now-exposed channel region of a fin portion as described above. At the block 614 well and PTS implantation is performed into the exposed channel region of the fin portion. Subsequently, at block 616 gate dielectric is deposited on the exposed channel region of the fin portion, and at block 618 metal gate is deposited on the gate dielectric.

In the block 620 a gate stack annealing process is performed. This annealing process may be the first annealing process that takes place after $V_T$-adjustment implant and well implants are performed. Accordingly, the thermal budget that is imposed on the finFET device under fabrication after $V_T$ adjustment implant and well implants is reduced in comparison to conventional finFET processing. At block 622 contact formation and back-end-of-line processing is performed.

Although the aforementioned examples have illustrated a process sequence that may involve formation of a single type of field effect transistor device, such as an nFET, the present embodiments cover formation of finFET transistors in CMOS devices in which separate threshold voltage implantation processes are performed for a pFET as opposed to nFET. In various embodiments, both nFET $V_T$ adjustment implants and pFET $V_T$ adjustment implants may be performed after dummy gate removal. Additionally, the present embodiments cover finFET fabrication techniques in which multiple different threshold voltages may be set for different pFET devices and multiple different threshold voltages may be set for different nFET devices. For example integrated circuit devices such as system-on-a-chip (SOC) devices may implement three different nFETs having three different target or nominal threshold voltages that may span a range of hundreds of millivolts between them. Similarly, such an SOC device may include three different pFETs having three different threshold voltages that may span a range of hundreds of millivolts between them. Accordingly, finFET devices fabricated according to the present embodiments may entail two, four, or six different threshold voltage adjustment implants, each of which is performed at a different ion dose or ion energy. The embodiments are not limited in this context In summary, the present embodiments provide multiple advantages over conventional finFET devices. For one, threshold voltage adjustment implants are scheduled in a manner that reduces the thermal budget experienced by the implanted ions used to adjust threshold voltage. Moreover, devices fabricated according to the techniques of the present embodiments require less implant dose to produce a given adjustment of threshold voltage. Stated another way, a given implant dose produces a larger threshold voltage change when implemented in the techniques of the present embodiments as compared to when implemented in a conventional finFET fabrication process.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of forming a fin field effect transistor (finFET) device, comprising:
    forming a fin structure on a substrate, the substrate comprising a semiconductor material;
    forming a replacement gate cavity comprising an exposed portion of the fin structure and a sidewall portion adjacent the exposed portion, wherein the exposed portion of the fin structure defines a channel region, and wherein the forming the replacement gate cavity comprises:
        depositing a dummy gate material on the fin structure;

etching the dummy gate material to form a dummy gate;

forming the sidewall portion on the dummy gate; and selectively etching the dummy gate without removing the sidewalls; and performing at least one implant into the exposed portion of the fin structure.

2. The method of claim 1, wherein the at least one implant includes a threshold voltage adjustment implant having an ion dose effective to adjust a threshold voltage of a finFET on the finFET device.

3. The method of claim 1, further comprising selectively depositing a raised source drain on the exposed portions of the fin structure after the etching of the dummy gate.

4. The method of claim 2, further comprising depositing a replacement gate in the replacement gate cavity after performing the threshold voltage adjustment implant.

5. The method of claim 2, further comprising performing a well implant into the exposed portion of the fin structure after the forming of the replacement gate cavity.

6. The method of claim 2 wherein the fin structure comprises a fin structure of a first field effect transistor type, and the threshold voltage adjustment implant comprises a first threshold voltage implant, the method further comprising:

forming a second fin structure on the substrate;

forming a second replacement gate cavity comprising an exposed portion of the second fin structure and a sidewall portion adjacent the exposed portion, wherein the exposed portion of the second fin structure defines a second channel region; and performing a second threshold voltage adjustment implant different from the first threshold voltage adjustment implant, the second threshold voltage adjustment implant comprising implanting ions into the second channel region at an ion dose effective to adjust threshold voltage of a second finFET of the finFET device, wherein the finFET and the second finFET differ in dopant type or nominal threshold voltage.

7. The method of claim 1, wherein a length of the exposed portion of the fin structure is 50 nm or less, and wherein a width of the exposed portion of the fin structure is 25 nm or less.

8. The method of claim 2, wherein the finFET is an n type finFET, wherein the threshold voltage adjustment implant is effective to increase linear threshold voltage with increased ion dose at a rate of 22 meV/1×E13/cm$^2$ ion dose.

9. A method to control threshold voltage in a fin field effect transistor (finFET) device comprising a fin structure formed integrally within a semiconductor material, the method comprising:

forming a dummy gate that bounds a channel region of the fin structure;

forming a source/drain region in a second portion of the fin structure outside the channel region;

annealing the source/drain region;

removing the dummy gate; and implanting the channel region of the fin structure after the annealing the source/drain region.

10. The method of claim 9, wherein the removing the dummy gate comprises forming a replacement gate cavity comprising an exposed portion that defines the channel region of the fin structure.

11. The method of claim 10, wherein the forming the replacement gate cavity comprises:

depositing a dummy gate material on the fin structure;

etching the dummy gate material to form the dummy gate;

forming a sidewall on the dummy gate; and selectively etching the dummy gate without removing the sidewalls.

12. The method of claim 9, further comprising performing a well implantation and well annealing into the fin structure before the forming the dummy gate.

13. The method of claim 9, further comprising performing a well implantation after the removing the dummy gate.

14. The method of claim 10, further comprising:

after the implanting the channel region of the fin structure, forming a replacement gate in the replacement gate cavity; and performing a gate anneal.

15. The method of claim 9, wherein the implanting the channel region comprises performing a threshold voltage adjustment implant.

16. The method of claim 15, wherein the implanting the channel region further comprises performing a well implant.

17. A method of forming a fin field effect transistor (finFET) device, comprising:

forming a fin structure on a substrate, the substrate comprising a semiconductor material;

forming a replacement gate cavity comprising an exposed portion of the fin structure and a sidewall portion adjacent the exposed portion, wherein the exposed portion of the fin structure defines a channel region;

performing at least one implant into the exposed portion of the fin structure, wherein the at least one implant includes a threshold voltage adjustment implant having an ion dose effective to adjust a threshold voltage of a finFET on the finFET device, and wherein the fin structure comprises a fin structure of a first field effect transistor type, and the threshold voltage adjustment implant comprises a first threshold voltage implant;

forming a second fin structure on the substrate;

forming a second replacement gate cavity comprising an exposed portion of the second fin structure and a sidewall portion adjacent the exposed portion, wherein the exposed portion of the second fin structure defines a second channel region; and performing a second threshold voltage adjustment implant different from the first threshold voltage adjustment implant, the second threshold voltage adjustment implant comprising implanting ions into the second channel region at an ion dose effective to adjust threshold voltage of a second finFET of the finFET device, wherein the finFET and the second finFET differ in dopant type or nominal threshold voltage.

* * * * *